(12) United States Patent
Nonaka et al.

(10) Patent No.: US 7,622,720 B2
(45) Date of Patent: Nov. 24, 2009

(54) EXPOSURE DEVICE

(75) Inventors: Jun Nonaka, Machida (JP); Duk Lee, Machida (JP); Yoshinori Kobayashi, Machida (JP)

(73) Assignee: ORC Maufacturing Co., Ltd., Tokyo (JP)

( * ) Notice: Subject to any disclaimer, the term of this patent is extended or adjusted under 35 U.S.C. 154(b) by 0 days.

(21) Appl. No.: 12/079,435

(22) Filed: Mar. 27, 2008

(65) Prior Publication Data
US 2008/0258069 A1 Oct. 23, 2008

(30) Foreign Application Priority Data
Mar. 28, 2007 (JP) .............. 2007-083881

(51) Int. Cl.
*G01J 1/42* (2006.01)
(52) U.S. Cl. .................... 250/372
(58) Field of Classification Search ........... 250/372, 250/492.1, 492.2; 378/34
See application file for complete search history.

(56) References Cited
U.S. PATENT DOCUMENTS
2003/0180453 A1* 9/2003 Burke et al. .......... 427/162

2006/0193432 A1* 8/2006 Matsumoto ............ 378/34
2007/0030466 A1* 2/2007 Shuichi ................. 355/30

FOREIGN PATENT DOCUMENTS
JP 2006-113413 4/2006
JP 2006-337475 12/2006
JP 2006-343684 12/2006

* cited by examiner

*Primary Examiner*—David P Porta
*Assistant Examiner*—Kiho Kim
(74) *Attorney, Agent, or Firm*—Dilworth & Barrese LLP

(57) ABSTRACT

The present invention relates to an exposure device for forming predetermined patterns onto an object. The exposure device includes an optical source for emitting a ray, an aperture member including first and second opening windows and a detection window, first and second reflective optical elements for reflecting the first and second light beams that have passed through the first and second opening windows, respectively, and an optical sensor for detecting intensity of the ray from the optical source which has passed through the detection window, the optical sensor being placed close to an area between the first and second reflective optical elements.

15 Claims, 10 Drawing Sheets

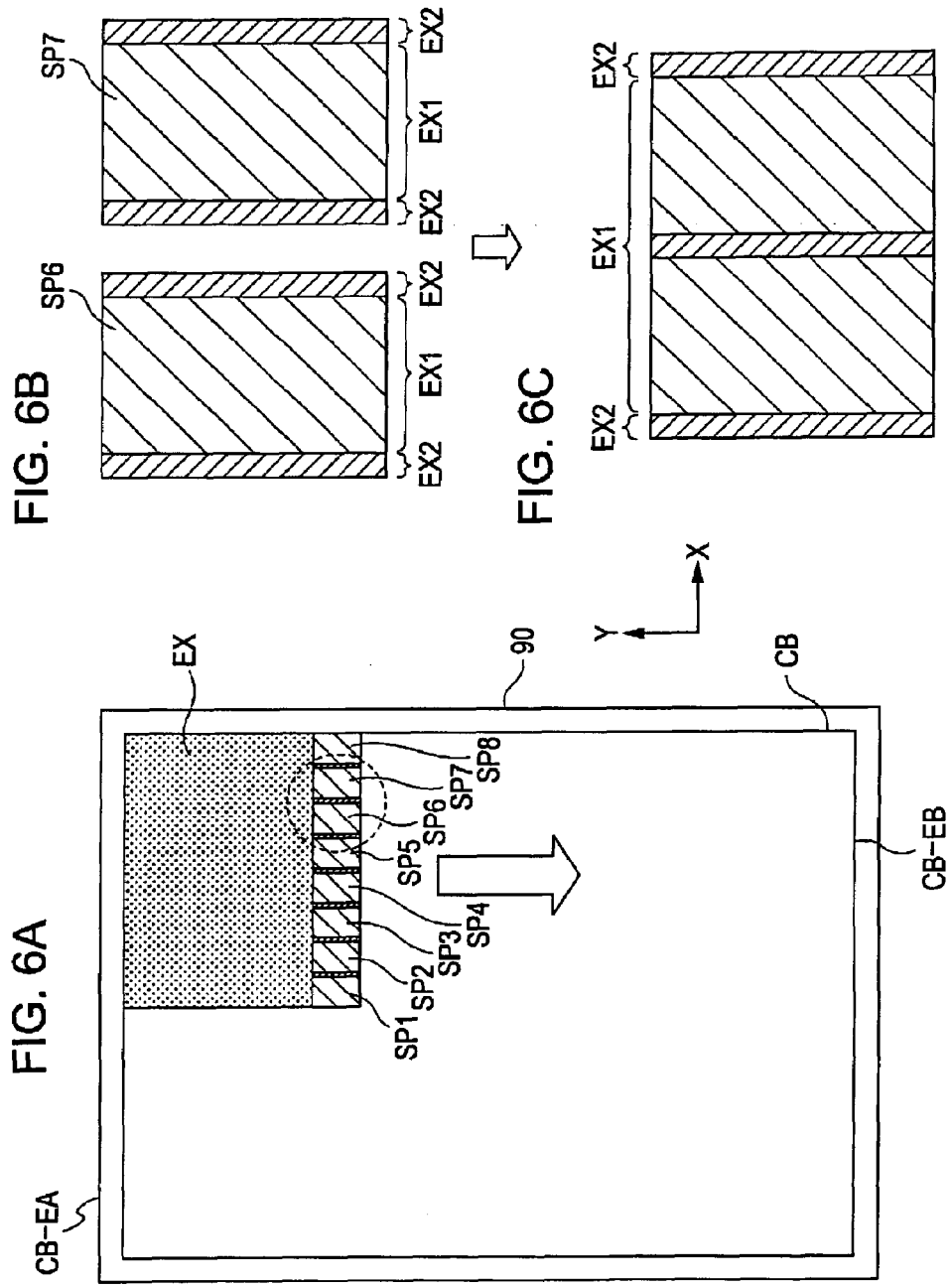

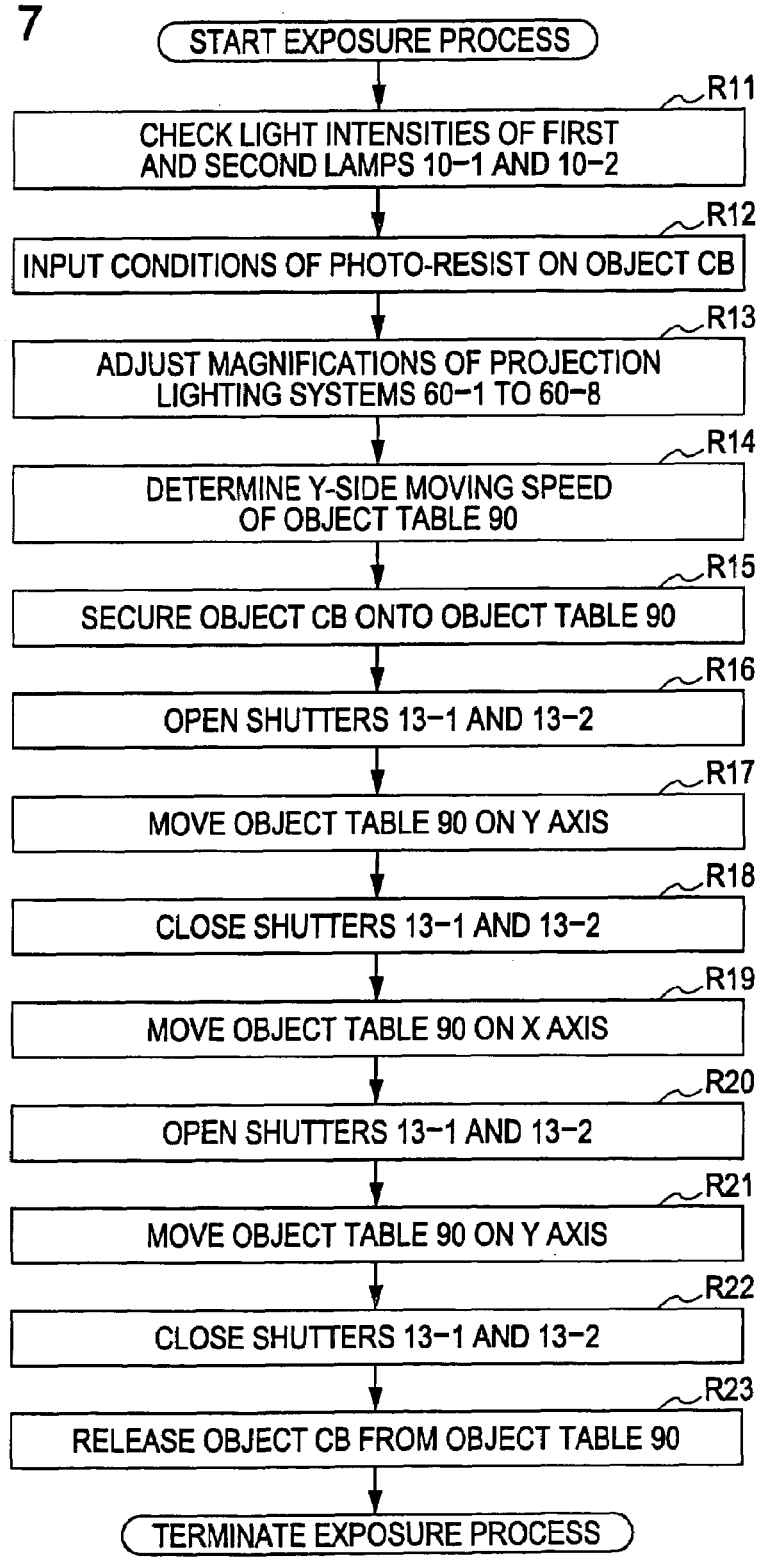

EXPOSURE DEVICE

CROSS-REFERENCE TO RELATED APPLICATIONS

This application claims the benefit of Japanese Patent Application 2007-083881 filed on Mar. 28, 2007, the disclosure of which is incorporated herein by reference.

BACKGROUND OF THE INVENTION

1. Field of the Invention

The present invention relates to an exposure device for forming patterns on a surface of a flat-sheet material, including a substrate for an electronic circuit, a glass substrate for an LCD and a glass element substrate for a PDP.

2. Description of the Related Art

In general, substrates for electronic circuits or printed circuits are applied to electronic instruments such as portable phones or various types of PCs. On a substrate of this type, multiple fine patterns, lands and via-holes tend to be formed with great precision. In addition, an exposure device which forms such miniature patterns is required to handle many different types of substrates in a short period. In order to follow the trend as well as meet the requirement, an exposure device uses high-intensity and short-wavelength light. However, a general type, that is, contact or projection type exposure device needs to contain masks to form patterns. Accordingly, multiple different masks are prepared depending on the types of substrates to be processed. However, those masks are hard to prepare, exchange or maintain, thus making it difficult to treat many different substrates efficiently.

Because of this disadvantage, interest is growing in a direct type exposure system and a device incorporating this system. This direct type exposure system has digital micro-mirror devices (DMDs) composed of many reflective mirrors, and moves those mirrors based on the CAD data. As a result, desired patterns are transferred from CAD data to a substrate by means of light beams, so that masks are unnecessary (see JP A 2006-113413, JP A 2006-343684 and JP A 2006-337475).

However, a typical direct type exposure device tends to have a low reaction speed in forming patterns, because its light source is a laser of short wavelength such as 405 nm. Hence, this property may cause the deterioration of the production capacity.

In addition to the low production capacity, a typical direct exposure device involves a cost increase. This is because it is equipped with many spatial light modulation elements for treating large-size substrates. If high-intensity light beams are irradiated to those many spatial light modulation elements, then many light sources are required, thus leading to the increase in the material costs.

Taking the above description into account, the present invention has been conceived. An object of the present invention is to provide a direct type exposure device which works efficiently. An additional object of the present invention is to present a direct type exposure device which has a few optical sources and many digital micro-mirror devices (DMDs) functioning as spatial light modulation devices. A further object of the present invention is to produce a direct type exposure device which is designed to monitor the intensity of its light source(s).

SUMMARY OF THE INVENTION

According to a first aspect of the present invention, there is provided, an exposure device for forming predetermined patterns onto an object, comprising:

a1) an optical source for emitting a ray containing a UV spectral line;

a2) an aperture member including first and second opening windows and a detection window, the first and second opening windows through which the ray from the optical source is split into first and second light beams, respectively, the detection window through which intensity of the ray is detected;

a3) first and second reflective optical elements for reflecting the first and second light beams that have passed through the first and second opening windows, respectively; and a4) an optical sensor for detecting the intensity of the ray from the optical source which has passed through the detection window, the optical sensor being placed close to an area between the first and second reflective optical elements.

In the exposure device of the first aspect, the optical sensor is provided downstream from the detection window of the aperture member. Hence, the optical sensor can detect the intensity of the pre-split ray. In addition, since the optical sensor is positioned close to the area between the first and second reflective optical elements, an inner space can be utilized efficiently. Consequently, in the exposure process, the exposure light of an appropriate intensity can be used.

According to a second aspect of the present invention, there is provided, the exposure device according to the first aspect, further comprising:

b1) a first spatial light modulator for spatially modulating the first light beam reflected by the first reflective optical element, based on inputted first image data;

b2) a second spatial light modulator for spatially modulating the second light beam reflected by the second reflective optical element, based on inputted second image data; and b3) a controller for controlling operations of the first and second spatial light modulators, depending on the intensity detected by the optical sensor.

The exposure light that is irradiated to the object must have a predetermined intensity. In the exposure device of the second aspect, if the intensity detected by the optical sensor is too high, then the controller shortens the time period during which the first and second spatial light modulators face the object, that is, the time period during which the first and second light beams are irradiated to the object.

According to a third aspect of the present invention, there is provided, the exposure device according to the first or second aspect, further comprising:

c1) an object stage for holding the object and for moving at a variable speed. In addition, the speed is changed by the controller, depending on the intensity detected by the optical sensor.

In the exposure device of the third aspect, when the intensity detected by the optical sensor is too high, the controller increases the moving speed of the object stage.

According to a fourth aspect of the present invention, there is provided, the exposure device according to one of the first to third aspects, further comprising:

d1) a power supply source for supplying electric power to the optical source. In addition, the electric power is changed by the controller, depending on the intensity detected by the optical sensor.

In the exposure device of the fourth aspect, when the intensity detected by the optical sensor is too high, the controller decreases the electric power which the power supply source supplies the optical source. This enables the exposure device to carry out the exposure process using the exposure light of an appropriate intensity.

According to a fifth aspect of the present invention, there is provided, the exposure device according to the first or second aspect, in which each of the first and second reflective optical elements is provided with a light-transmitting zone through which the ray from the detection window passes.

In the exposure device of the fifth aspect, with the light-transmitting zone of the first and second reflective optical elements, the optical sensor can be placed underneath them, so that an inner space is utilized efficiently.

According to a sixth aspect of the present invention, there is provided, the exposure device according to one of the first to fifth aspects, in which the optical source comprises a high pressure mercury lamp, and an input operation becomes possible after the intensity detected by the optical sensor reaches a predetermined threshold.

In general, a high pressure mercury lamp needs a considerably long time to become normal status since it is turned on. Assume that exposure conditions are set through the input unit, before the lamp starts operating in normal status. In this case, the lamp may be considered to be dead, and it is exchanged for new one. Following this, the exposure conditions are set again. This can be time-wasting and troublesome operation. Therefore, the initial setting of exposure conditions becomes possible, after the intensity of the high pressure mercury lamp reaches the predetermined threshold.

According to a seventh aspect of the present invention, there is provided, an exposure device for forming predetermined patterns onto an object, comprising:

e1) first and second optical sources for emitting rays containing a UV spectral line;

e2) first and second power supply sources for supplying electric power to the first and second optical sources;

e3) a first aperture member for first and second opening windows and a first detection window, the first and second opening windows through which the ray from the first optical source is split into first and second light beams, the first detection window through which intensity of the ray from the first optical source is detected;

e4) a second aperture member for third and fourth opening windows and a second detection window, the third and fourth opening windows through which the ray from the second optical source is split into third and fourth light beams, the second detection window through which intensity of the ray from the second optical source is detected;

e5) a first optical sensor for detecting the intensity of the ray from the first optical source through the first detection window;

e6) a second optical sensor for detecting the intensity of the ray from the second optical source through the second detection window;

e7) a power supply controller for controlling the first and second power supply sources in such a way that the intensities detected by the first and second optical sensors fall within a predetermined range;

e8) first and second spatial light modulators for spatially modulating the first and second light beams that have passed through the first and second opening windows, based on inputted first and second image data, respectively;

e9) third and fourth spatial light modulators for spatially modulating the third and fourth light beams that have passed through the third and fourth opening windows, based on inputted third and fourth image data, respectively; and e10) a controller for controlling operations of the first to forth spatial light modulators, based on difference between the intensities detected by the first and second optical sensors.

The exposure device of the seventh aspect has the two optical sources. Hence, the power supply controller controls the first and second power supply in such a way that the intensities detected by the first and second optical sensors fall within a predetermined range. Even when both intensities are different from each other, the controller can compensate this difference by controlling the first to fourth spatial light modulators. This enables the exposure device to operate appropriately using the first to fourth spatial light modulators.

According to an eighth aspect of the present invention, there is provided, the exposure device according to the seventh aspect, further comprising a memory unit for storing data on an age deterioration of the rays from the first and second light sources. Furthermore, in this exposure device, status of routes between the first and second light sources and the first and second aperture members is detected by comparing time-based variation in the intensities detected by the first and second optical sensors with the age deterioration stored in the memory unit.

The exposure device of the eighth aspect memorizes data on the age deterioration of the first and second optical sources. Moreover, it continuously monitors the intensities detected by the first and second optical sensors. If they are considerably different from each other, then the device determines that any abnormality has occurs. In other words, the device can detect the status of the routes between the first and second optical sources and the first and second aperture members.

According to a ninth aspect of the present invention, there is provided, the exposure device according to the seventh or eighth aspect, further comprising first to fourth projection optical systems for guiding the first to fourth light beams from the first to fourth spatial light modulators to the object, respectively, the first to fourth projection systems being arrayed.

This structure is fabricated and maintained easily.

In the exposure device of the present invention, the ray(s) from light source(s) is/are split into multiple light beams by the aperture members, the intensity of the ray(s) is detected, and the operations of the spatial light modulators, the electric power supplied to the optical source(s), etc. are controlled properly based on the detected intensity. If provided with the two optical sources, then the exposure device adjusts the intensities of both optical sources, and monitors the age deterioration of the optical sources. In conclusion, with the exposure device of the present invention, proper and stable exposure process can be executed.

Other aspects, features and advantages of the present invention will become apparent upon reading the following specification and claims when taken in conjunction with the accompanying drawings.

BRIEF DESCRIPTION OF THE DRAWINGS

For more complete understanding of the present invention and the advantages hereof, reference is now made to the following description taken in conjunction with the accompanying drawings wherein:

FIG. 6A is a view depicting an exposure process applied to an object CB on an object table 90;

FIG. 6B is a view depicting a stitching operation of the exposure device 100;

FIG. 6C is another view depicting the stitching operation;

FIG. 7 is a flowchart of the exposure process performed by the exposure device 100;

DETAILED DESCRIPTION OF THE EXEMPLARY EMBODIMENTS OF THE INVENTION

<Whole Structure of Exposure Device>

Figure 1:
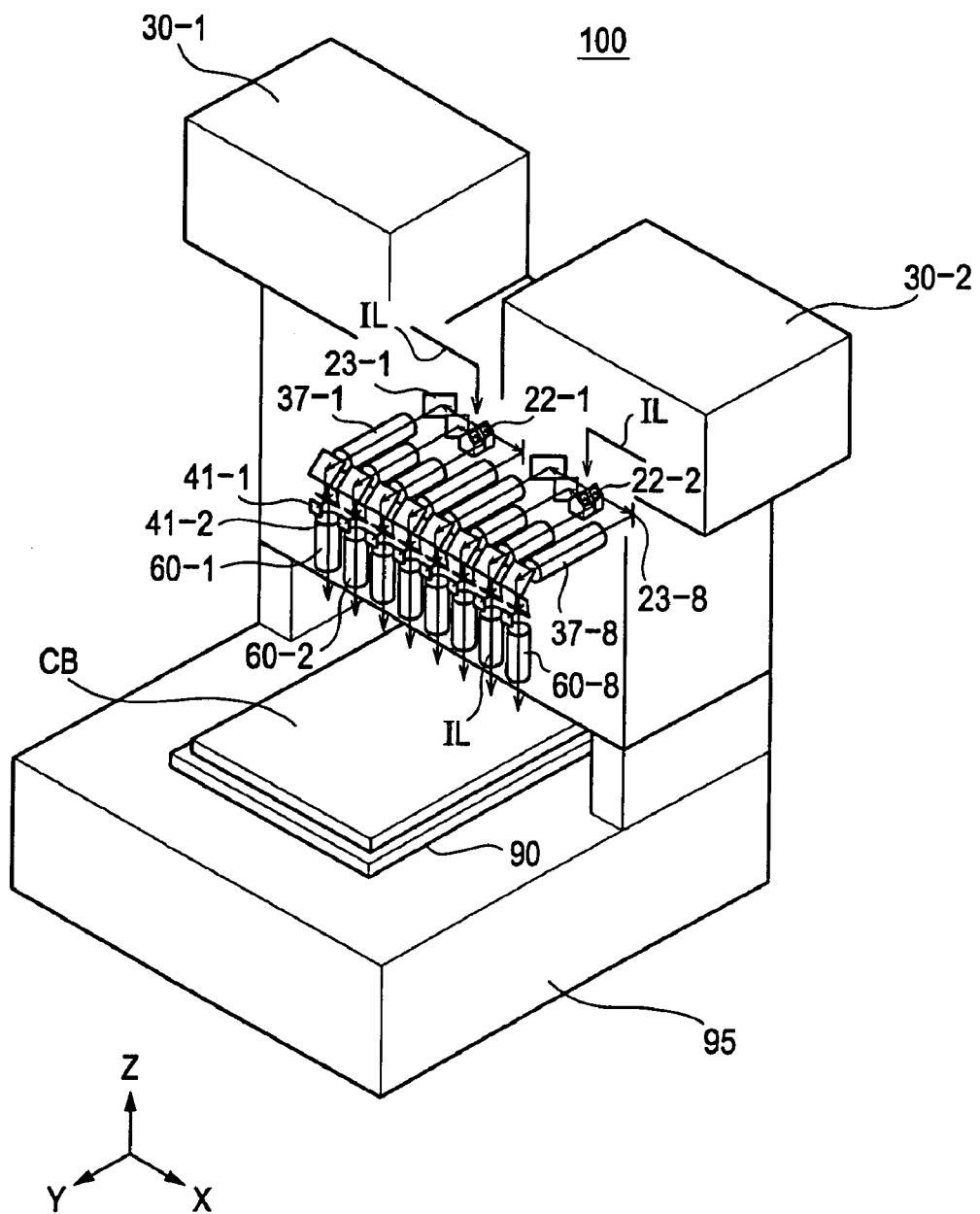
FIG. 1 is a schematically perspective view depicting an exposure device 100 according to one embodiment of the present invention.

FIG. 1 schematically shows an exposure device 100 according to an embodiment of the present invention. This exposure device 100 mainly includes first lighting systems 30-1 and 30-2, second lighting systems 37-1 to 37-8, spatial light modulation systems (thereinafter referred to as "DMDs") 41-1 to 41-8, projection optical systems 60-1 to 60-8, and an object table 90. The reason why the two first lighting systems (30-1 and 30-2) are used is to irradiate an object CB widely. These first lighting systems 30-1 and 30-2 contain a first high-pressure mercury lamp 10-1 and a second high-pressure mercury lamp 10-2 (see FIG. 2), respectively.

Figure 2:
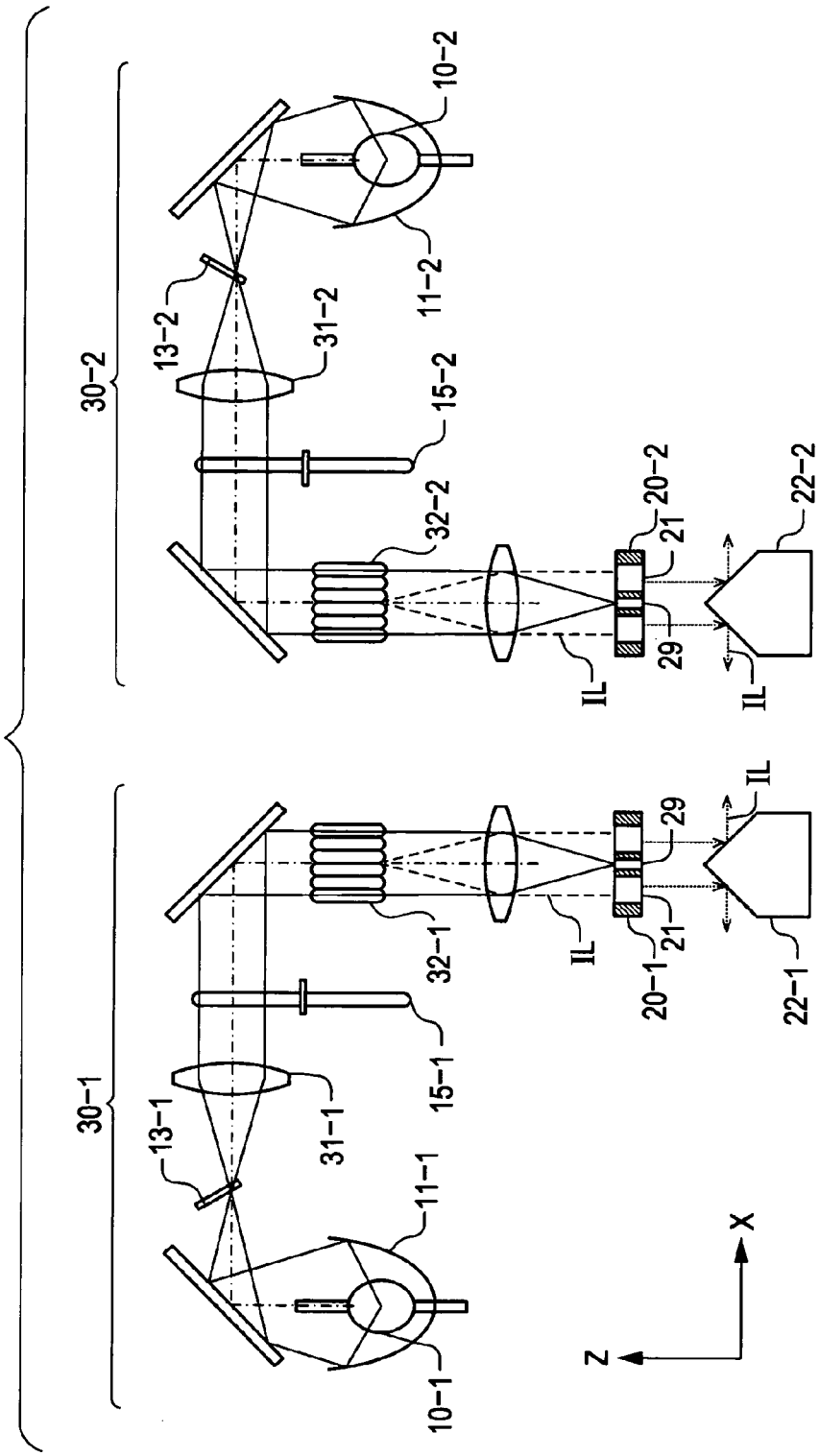
FIG. 2 is a schematic view depicting first lighting systems 30-1 and 30-2 of the exposure device 100.

FIG. 2 schematically shows the first lighting systems 30-1 and 30-2. Since both lighting systems have the identical structure, only the first lighting system 30-1 will be described below.

In this drawing, the first high-pressure mercury lamp 10-1 is located at a primary focal point of an elliptic mirror 11-1. The elliptic mirror 11-1 reflects efficiently the UV light emitted from the first high-pressure mercury lamp 10-1 toward a secondary focal point of an elliptic mirror 11-1. In this embodiment, the first high-pressure mercury lamp 10-1 is used, but the optical source is not limited to it in this invention. Alternatively, a xenon or flash lamp may be utilized. This first high-pressure mercury lamp 10-1 is designed to constantly emit a light beam IL while being supplied with electric power through a first power supply controller 19-1 (see FIG. 8). In this way, the intensity of the light beam IL is made stable. A shutter 13-1 is placed at the secondary focal point of the elliptic mirror 11-1 and blocks off the light beam IL when the device 100 does not need to irradiate the object CB. The light beam IL from the first high-pressure mercury lamp 10-1 concentrates at the secondary focal point. Accordingly, the shutter 13-1 is positioned at the secondary focal point, so that it does not have to move greatly to block off the light beam IL.

The first lighting system 30-1 includes a collimator lens 31-1 and a fly-eye lens 32-1, and they shape the light beam IL into a beam of a uniform density. The light beam IL diverges from a point image at the secondary focal point, and is then incident to the collimator lens 31-1. This incident light beam is converted into a collimated beam, and is then inputted to a wavelength selection filter 15-1.

The wavelength selection filter 15-1 is composed of a combination of several filter elements. Examples of those filter elements include an ND filter for adjusting the intensity of light, a g-h-i line filter (passing g, h and i lines) for cutting off light of 350 nm or shorter and 450 nm or longer, an i line filter (passing i line) for cutting off light of 350 nm or shorter and 380 nm or longer, an h line filter (passing h line) for cutting off light of 390 nm or shorter and 420 nm or longer, and a g line filter (passing g line) for cutting off light of 420 nm or shorter and 450 nm or longer. The combination of the filter elements is determined depending on a photoresist of the object CB.

The light beam IL that has passed through the wavelength selection filter 15-1 has desired wavelength, and this beam is incident to the fly-eye lens 32-1 in order to make its density uniform.

Next, the light beam IL enters an aperture member 20-1 provided with four opening windows 21 and a detection window 29 for sensing light intensity. The light beam IL is inputted to the aperture member 20-1 in parallel with the Z axis, that is, perpendicularly to the incident surface of the aperture member 20-1. The light beam IL that has passed through the aperture member 20-1 is split into four beams IL. Finally, the beams IL1 to IL4 are reflected by a reflective optical element 22-1 composed of total reflection mirrors or a prism, and the reflected beams then travel laterally.

Referring to FIG. 1 again, the eight light beams IL (formed by the aperture members 20-1 and 20-2 and the reflective optical elements 22-1 and 22-2) are reflected by a corresponding one of the total reflection mirrors 23-1 to 23-8, and they then travel in parallel with the Y axis. Subsequently, the eight light beams IL are incident on a corresponding one of the second lighting systems 37-1 and 37-8.

The light beams IL are subjected to a beam shaping in the second lighting systems 37-1 to 37-8, so that they each have a predetermined shape and preset intensity. Following this, the light beams IL are thrown to eight arrayed DMDs 41-1 to 41-8. The DMDs 41-1 to 41-8 spatially modulate the light beams IL based on an input image data. The light beams IL modulated by the DMDs 41-1 to 41-8 pass through the projection optical systems 60-1 and 60-8, respectively, so that each beam has a predetermined magnification. Finally, the light beams IL are irradiated to the object CB.

The projection optical systems 60-1 to 60-8 precisely adjust the magnifications of the light beams IL. As a result, the identical eight irradiated areas are created on the object. Moreover, the magnifications may be varied depending on the size of the object CB. The exposure device 100 has the eight projection optical systems 60-1 to 60-8 which are arrayed on the X axis.

Note that those DMDs 41-1 to 41-8 and the projection optical systems 60-1 to 60-8 are easy to fabricate and maintain.

The exposure device 100 includes a base 95 under the projection optical systems 60-1 to 60-8 with reference to the Z axis, and it supports the first lighting systems 30-1 and 30-2, the second lighting systems 37-1 to 37-8 and the projection optical systems 60-1 and 60-8. The base 95 has a pair of guide rails, and an object table 90 is mounted on the guide rails. This object table 90 is driven by a mechanism (not shown) composed of, for example, a ball screw and a stepping motor. With this mechanism, the object table 90 is moved on the guide rails lengthwise or in parallel with the Y axis relative to the projection optical systems 60-1 to 60-8. On the object table 90, a photoresist-coated substrate is set as the object CB. This object CB is fixed onto the object table 90 by means of negative pressure. In the case where the projection optical system 60-1 to 60-8 cannot irradiate the whole lateral surface area of the object CB, then the object table 90 moves in parallel with the X axis.

<Second Lighting Systems Including Aperture Members and DMDs>

Each of the aperture members 20-1 and 20-2 is made of a material having a low thermal storage property and a low thermal expansion coefficient, such as metal or ceramics. This reason is that since partially exposed to the light beams IL, the aperture members 20-1 and 20-2 tend to be heated. Furthermore, the aperture members 20-1 and 20-2 may be provided with a heat sink in order to decrease the level of the deformation due to the thermal expansion.

The opening windows 21 in each of the aperture members 20-1 and 20-2 are as many as the DMDs 41-1 to 41-8. Each reflective surface of the DMD may be 14 mm by 12 mm in size. The light beam IL irradiated to the DMDs needs to have a rectangular shape in accordance with that of the reflective surface. Furthermore, the light beams IL are required to be as many as the reflective surfaces of the DMDs.

Figure 3:
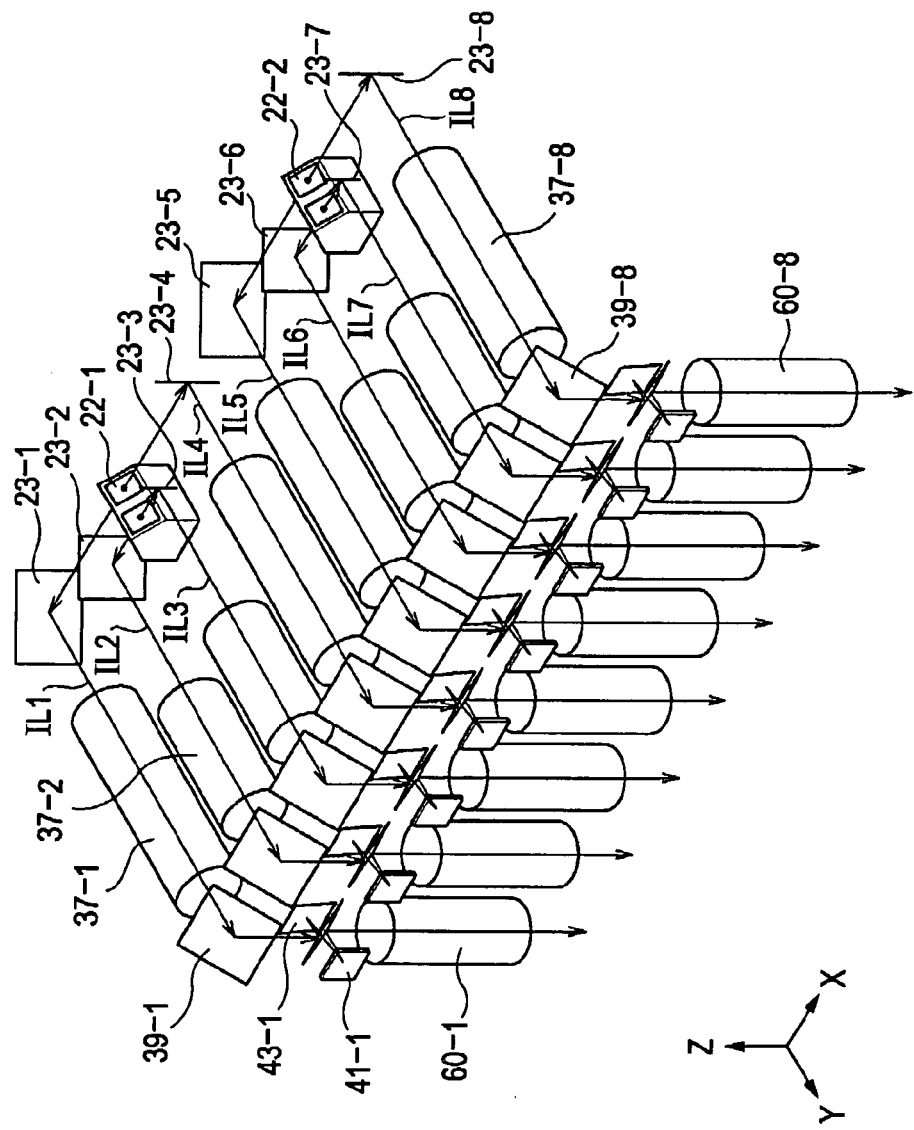
FIG. 3 is a schematic view depicting second lighting systems 37-1 to 37-8, DMDs 41-1 to 41-8 and projection optical systems 60-1 to 60-8 of the exposure device 100.
Figure 4:
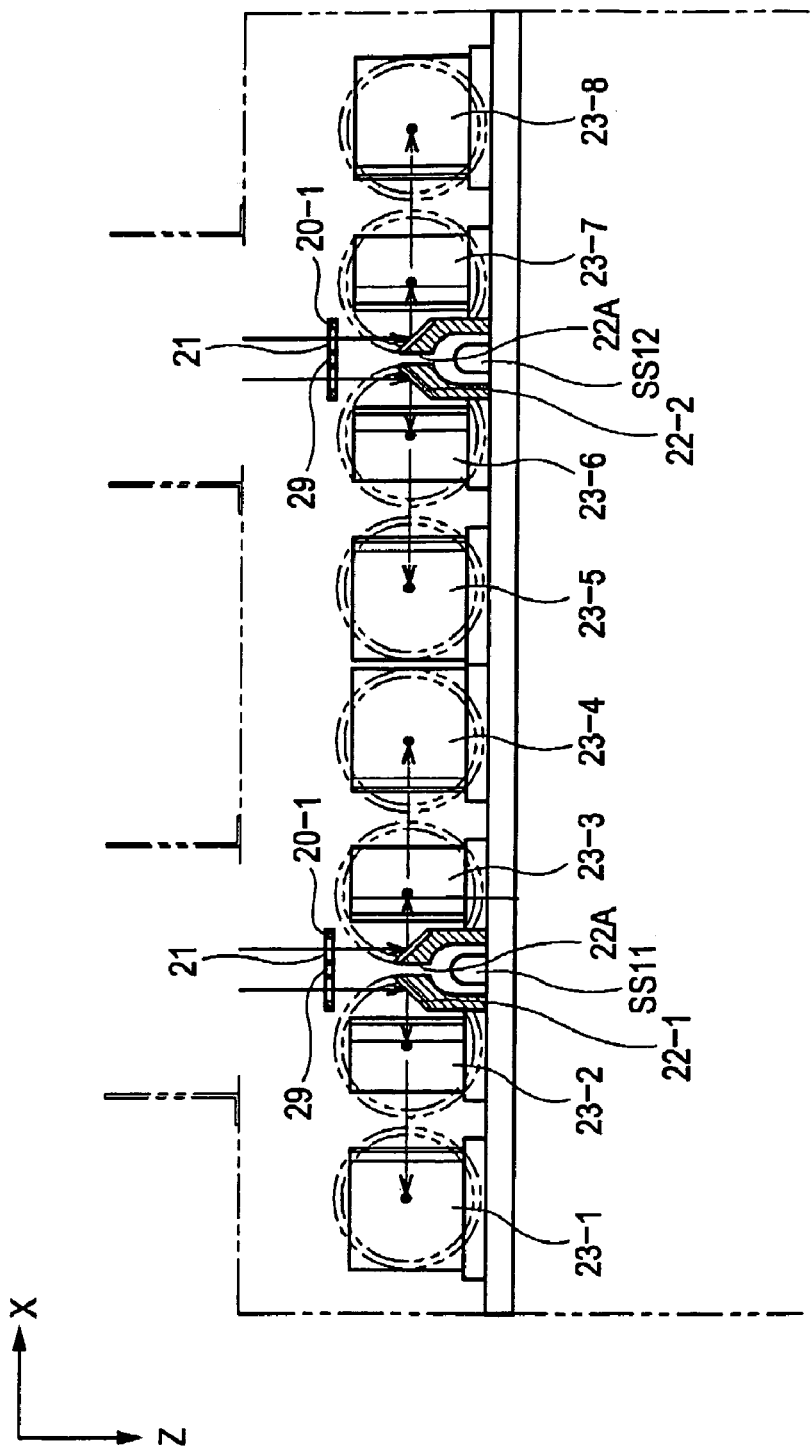
FIG. 4 is a schematic view depicting reflective optical elements 22-1 and 22-2 and total reflection mirrors 23-1 to 23-8 of the exposure device 10 as seen on a Y axis.

FIG. 3 shows the second lighting systems 37-1 to 37-8, the DMDs 41-1 to 41-8 and the projection optical systems 60-1 to 60-8. FIG. 4 shows the reflective optical elements 22-1 and 22-2 and the total reflection mirrors 23-1 to 23-8 as seen on the Y axis.

After passing through the aperture members 20-1 and 20-2, the eight light beams IL travel in parallel with the Z axis. Then, the light beams IL are reflected by a corresponding one of the reflective optical elements 22-1 and 22-2 that are constituted by flat mirrors or prisms. The reflected light beams IL travel in parallel with the X axis. Specifically, the four light beams IL that have been formed by the aperture member 20-1 are reflected by the reflective optical element 22-1. Subsequently, those four beams travel along paths IL1, IL2, IL3 and IL4 in parallel with the X axis, respectively. Likewise, the other four light beams IL, which are formed by the aperture member 20-2, are reflected by the reflective optical element 22-2 and, then travel along light paths IL5, IL6, IL7 and IL8 in parallel with the X axis, respectively. The eight light beams traveling along the paths IL1 to IL8 are reflected by the total reflection mirror 23-1 to 23-8, and are directed toward the DMDs 41-1 to 41-8 in parallel with the Y axis, respectively. As shown in FIG. 4, each of the reflective optical elements 22-1 and 22-2 has a light-transmitting zone 22A on its center. In this light-transmitting zone 22A, no through-holes or blocks are formed but merely a space is defined.

The light beams IL reflected from the total reflection mirrors 23-1 to 23-8 travel to the DMDs 41-1 to 41-8 through the second lighting systems 37-1 and 37-8, respectively. Each of the second lighting systems 37-1 and 37-8 is constituted by an iris adjuster and other optical components such as lenses. As shown in FIG. 3, the light paths IL1, IL4, IL5 and IL8 (that extend between the total reflection mirror and the DMDs) have the same length. Also, the light paths IL2, IL3, IL6 and IL7 are equal in length. However, each length of the light paths IL1, IL4, IL5 and IL8 is different from that of the light paths IL2, IL3, IL6 and IL7. After reflected by the DMDs 41-1 to 41-8, the light beams IL pass through the projection optical systems 60-1 to 60-8, respectively. Finally, they are irradiated to the object CB. Note that the light beams IL must have the same beam shape when irradiated to the object CB. However, unless all the distances between the DMDs 41-1 to 41-8 and the object CB are the same, the resolution, dimension and other properties of patterns formed on the object CD may differ depending on the light beams IL. In consideration of this fact, the light beams IL that travel along the paths IL1 to IL8 and that have been reflected from the total reflection mirrors 23-1 to 23-8, respectively are corrected to have the same focal length. After the correction, the beams are incident on the DMDs 41-1 to 41-8. Needless to say, if the lengths of the light paths IL1 to IL8 are different from one another, then all the light beams IL must be corrected individually.

<Optical Sensor>

As shown in FIG. 4, the exposure device 100 has first and second optical sensors SS11 and SS12 that detect light intensities of the first and second high-pressure mercury lamps 10-1 and 10-2, respectively. Those two sensors SS11 and SS12 are placed underneath the detection windows 29 of the aperture members 20-1 and 20-2, respectively. Both sensors are arranged as close as possible to the DMDs 41-1 to 41-8, so that they are less likely to be affected by the attenuation of the optical components of the first lighting systems 30-1 to 30-2.

The reflective optical elements 22-1 and 22-2 are located under the aperture members 20-1 and 20-2 with respect to the Z axis, respectively. When reaching a corresponding one of the reflective optical elements 22-1 and 22-2 in parallel with the Z axis, the light beams IL are totally reflected by them to thereby travel in parallel with the X axis. Thus, all the reflection surfaces of the reflective optical elements 22-1 and 22-2 are angled 45 degrees with respect to a plane parallel to the X and Y axes. Preferably, the size of those reflection surfaces is determined in accordance with the opening window 21. In addition, the adjacent reflection surfaces on the reflective optical element may be replaced by a single reflection surface. Each of the reflective optical elements 22-1 and 22-2 has the light-transmitting zone 22A under the detection window 29. The first and second optical sensors SS11 and SS12 are located in spaces under both light-transmitting zones 22A, respectively. Note that the respective shapes of the detection windows 29 and the light-transmitting zones 22A can have any other shape. For example, they may be circular or rectangular.

<DMD>

Figure 5A:
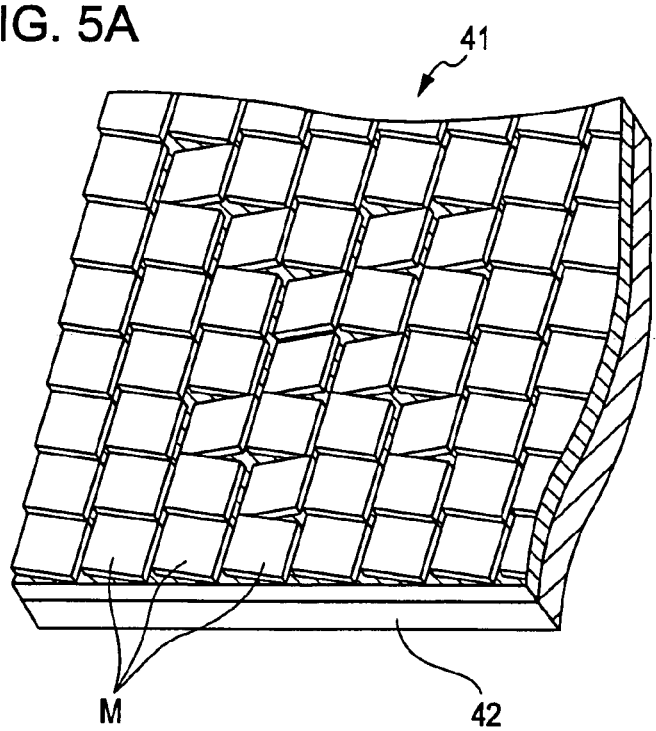
FIG. 5A is a perspective view of the DMD 41.

FIG. 5A shows the DMD 41, and FIG. 6B shows the function of the micro mirror M. In this embodiment, the exposure device 100 has the eight DMDS, and the reflection surface of each of them is composed of, for example, 1310720 (1024 by 1280) micro mirrors M arranged in a matrix fashion. In the DMD 41, the 1024 micro mirrors M are arrayed on the X side and 1280 micro mirrors M are arrayed on the Y side. Each micro mirror M is about 11.5 square IIm long.

Figure 5B:
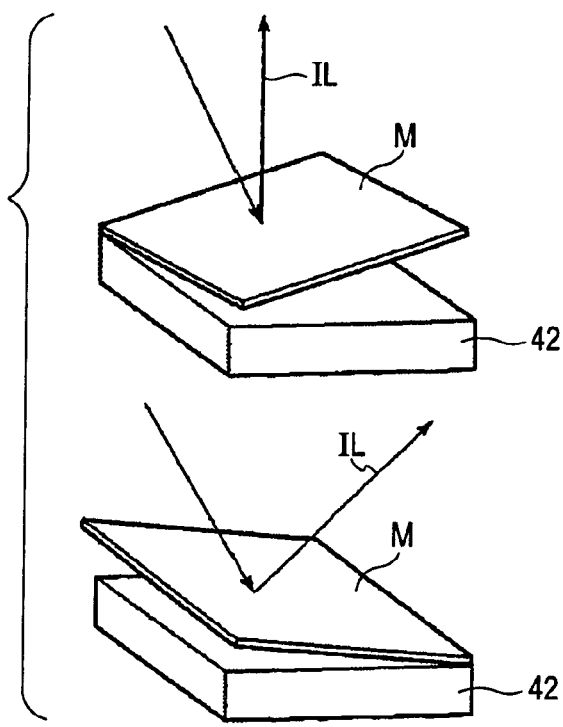
FIG. 5B is a schematic view depicting the movement of the micro mirror M.

The micro mirror M has a high reflection coefficient and is fabricated by subjecting an aluminum sputtering treatment to a wafer 42. The DMD 41 swivels the micro mirrors M by means of static electricity. As shown in FIG. 5B, the micro mirror M can be swiveled around the diagonal lines and have two stable orientations. Once the micro mirror M (m, n) ($1 \leq m \leq 1024$, $1 \leq n \leq 1280$) is positioned facing the object CB, the light beam IL reflected by the DMD 41 travels toward the projection optical system 60. Otherwise, once the micro mirror M (m, n) does not face the projection optical system 60, the light beam travels to a light absorber (not shown), that is, propagates away from the projection optical system 60.

<Operation of Exposure Devices>

Next, an operation of the exposure device 100 will be described below with reference to FIGS. 6A to 6C and 7.

FIG. 6A depicts the object CB having undergone an exposure process on the object table 90 by the exposure device 100. FIGS. 6B and 6C depict a stitching operation performed by the exposure device 100, and FIG. 7 depicts a flow of the exposure process.

Referring to FIG. 6A, filled rectangular areas SP1 to SP8 represent exposure blocks formed on the X-Y plane (see FIG. 1). In addition, those areas are created by the light beams IL from the projection optical systems 60-1 to 60-8, respectively. Specifically, the exposure blocks SP1 to SP8 arrayed on the X axis are formed by being exposed to the spatially modulated light beams. In addition, while the object table is moving on the Y axis (or in the arrow direction), those exposure blocks, that is, desired patterns are being formed on the whole surface of the object CB. The object CB has a photoresist ora dry film coated on its surface An exposure region EX consisting of the exposure blocks are extending toward one edge CB-EB of an object CB as the object table 90 is moving on the Y axis.

Once the exposure blocks SP1 to SP8 reach the edge of the object CB, the shutters 13-1 and 13-2 (see FIG. 2) are closed to block off the light beams IL. Subsequently, the object table 90 moves on the X axis until an unexposed area of the object CB is located directly under the projection optical systems 60-1 to 60-8. Then, after the shutters 13-1 and 13-2 are opened to pass the light beam IL therethrough, new exposure blocks SP1 to SP8 are formed on the non-exposed area of the object CB. As the object table 90 is moving on the Y axis, the exposure region EX is expanding toward the edge of the object CB. In this way, an electric circuit is finally formed on the whole surface of the object CB such as an electronic circuit substrate.

The above process flow will be described below in detail with reference to the flowchart of FIG. 7.

At a step R11, the exposure device 100 checks the light intensities of the first and second high-pressure mercury lamps 10-1 and 10-2 by using the first optical sensors SS11 and SS12, respectively. Based on the checked result, power supply controllers 19-1 and 19-2 (see FIG. 9) adjust both light intensities so as to have substantially the same value. After the adjustment is over, the shutters 13-1 and 13-2 block off the light beams IL.

At a step R12, an operator inputs, to the exposure device 100, the conditions of sensibility of the photoresist or the like coated on the object CB.

At a step R13, the exposure device 100 adjusts the magnifications of the projection optical systems 60-1 to 60-8. The object CB is assumed to be 640 mm long on the X side. The exposure device 100 adjusts the magnifications of the projection optical systems 60-1 to 60-8 such that each exposure block is 40 mm long on the X side. In this case, the total length of the exposure blocks SP1 to SP8 is 320 mm. Thus, if the object table 90 shifts in parallel with the X axis once, then the exposure process for the lateral area (640 mm long) of the object CB is finished. Note that this explanation ignores stitching regions (to be described later). In actual cases, the exposure device 100 adjusts the magnifications of the projection optical systems 60-1 to 60-8 such that each exposure block is 40 mm or longer on the X side. Alternatively, the exposure block may be 12 mm or 14 mm long in accordance with the width of the DMD. In this case, the magnification is adjusted to 1:1.

At a step R14, the exposure device 100 determines a speed at which the object table 90 moves in parallel with the Y axis (or in the direction of the arrow of FIG. 7A). Note that this determination is based on the photoresist of the object CB, the light intensities of the first and second high-pressure mercury lamps 10-1 and 10-2 and the magnifications of the projection optical systems 60-1 to 60-8.

At a step R15, the object table 90 absorbs the object CB by means of negative pressure, so that the object CB is fixed.

At a step R16, the exposure device 100 opens the shutters 13-1 and 13-2. As a result, patterns are being created on the object CB.

At a step R17, the exposure device 100 moves the object table 90 in parallel with the Y axis.

At a step R18, once the exposure blocks SP1 to SP8 reach an edge of the object CB, the shutters 13-1 and 13-2 block off the light beams IL. At this time, the exposure region EX occupies the half area of the object CB.

At a step R19, the exposure device 100 moves the object table 90 in parallel with the X axis.

At a step R20, the exposure device 100 opens the shutters 13-1 and 13-2, so that the patterns are being created on the object CB again.

At a step R21, the exposure device 100 moves the object table 90 in parallel with the Y axis (or in the direction opposite to the arrow of FIG. 6A).

At a step R22, once the exposure blocks SP1 to SP8 reach the edge of object CB, the shutters 13-1 and 13-2 block off the light beams IL. Now, the exposure region EX occupies the whole area of the object CB.

At the step R23, the object table 90 stops absorbing the object CB, and the operator or a transfer machine then removes it from the object table 90.

<Stitching Operation>

Next, the stitching operation will be described below.

In general, the borders between the exposure blocks SP seem to be distinguishing because of the misalignment of the blocks and the difference of intensities of the light beams IL. Hence, the stitching operation is taken place in order to decrease those distinguish levels. In FIG. 6B, the exposure blocks SP6 and SP7 of FIG. 7A are shown enlargedly and separately. Referring to this drawing, full exposure blocks EX1 and half exposure blocks EX2 are defined on the exposure blocks SP6 and SP7.

The full exposure block EX1 of the block SP6 is formed on the condition that the micro mirrors M of the DMD 41-6 are oriented to transmit the full amount of the light beam IL to the object CB in accordance with circuit patterns. In contrast, the half exposure blocks EX2 of the block SP6 are formed on the condition that the micro mirrors M of the DMD 41-6 are oriented to transmit the half amount of the light beam IL to the object CB. In order to create the circuit patterns on the half exposure blocks EX2, the exposure process needs to be repeated there twice. As to the full exposure block EX1 and the half exposure blocks EX2 of the block SP7, the micro mirrors M of the DMD 41-7 also operate in the same way as that of the DMD 41-6. Therefore, if the half exposure block EX2 of the exposure block SP6 overlaps with that of exposure block SP7, then the overlapped blocks turn into the single full exposure block EX1 as shown in FIG. 7C. Note that the half exposure block EX2 of the exposure block SP1 that is formed by a first exposure process is adapted to overlap with that of the exposure block SP8 that is formed by a second exposure process as shown in FIG. 6A.

In order to execute the above stitching operation, it is preferable that the DMDs 41-1 to 41-8 are arrayed as well as the projection lighting systems 60-1 to 60-8 are arrayed, as shown in FIG. 3. This arrangement is easy to fabricate and maintain.

<Adjustment of Light Intensity>

Figure 8:
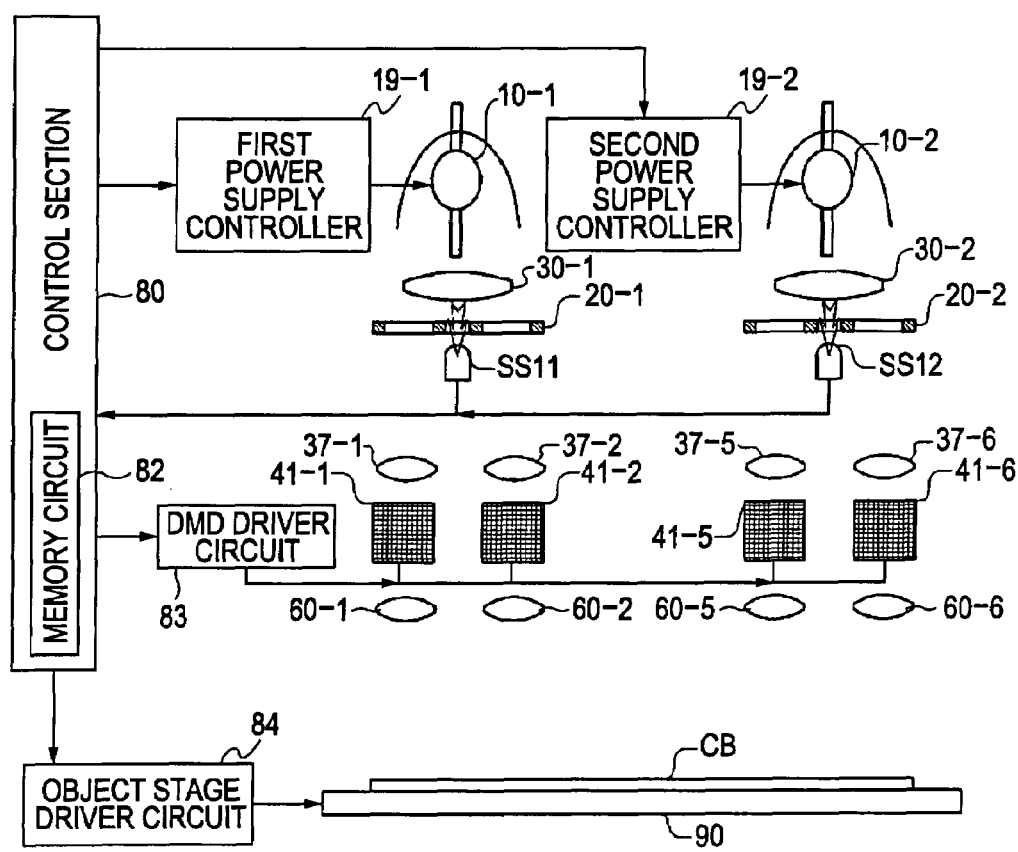
FIG. 8 is a block diagram for adjusting the light beams of the exposure device 100.

FIG. 8 shows a block diagram of a process for adjusting an exposure amount of the exposure device 100.

For the simplicity's sake, this block diagram depicts only the four second lighting systems (37-1, 37-2, 37-5 and 37-6), the four DMDs (41-1, 41-2, 41-3 and 41-4), and the four projection optical systems (60-1, 60-2, 60-5 and 60-6), although each of them is eight in number.

A control section 80 is connected to first and second power supply controllers 19-1 and 19-2, a DMD driver circuit 83 and an object stage driver circuit 84. Furthermore, the control section 80 contains a memory circuit 82 which stores a threshold "th" of light intensity of the first and second high-pressure mercury lamps 10-1 and 10-2 and their light intensity range "pr" required for the exposure process, as shown in FIG. 9.

Figure 9:
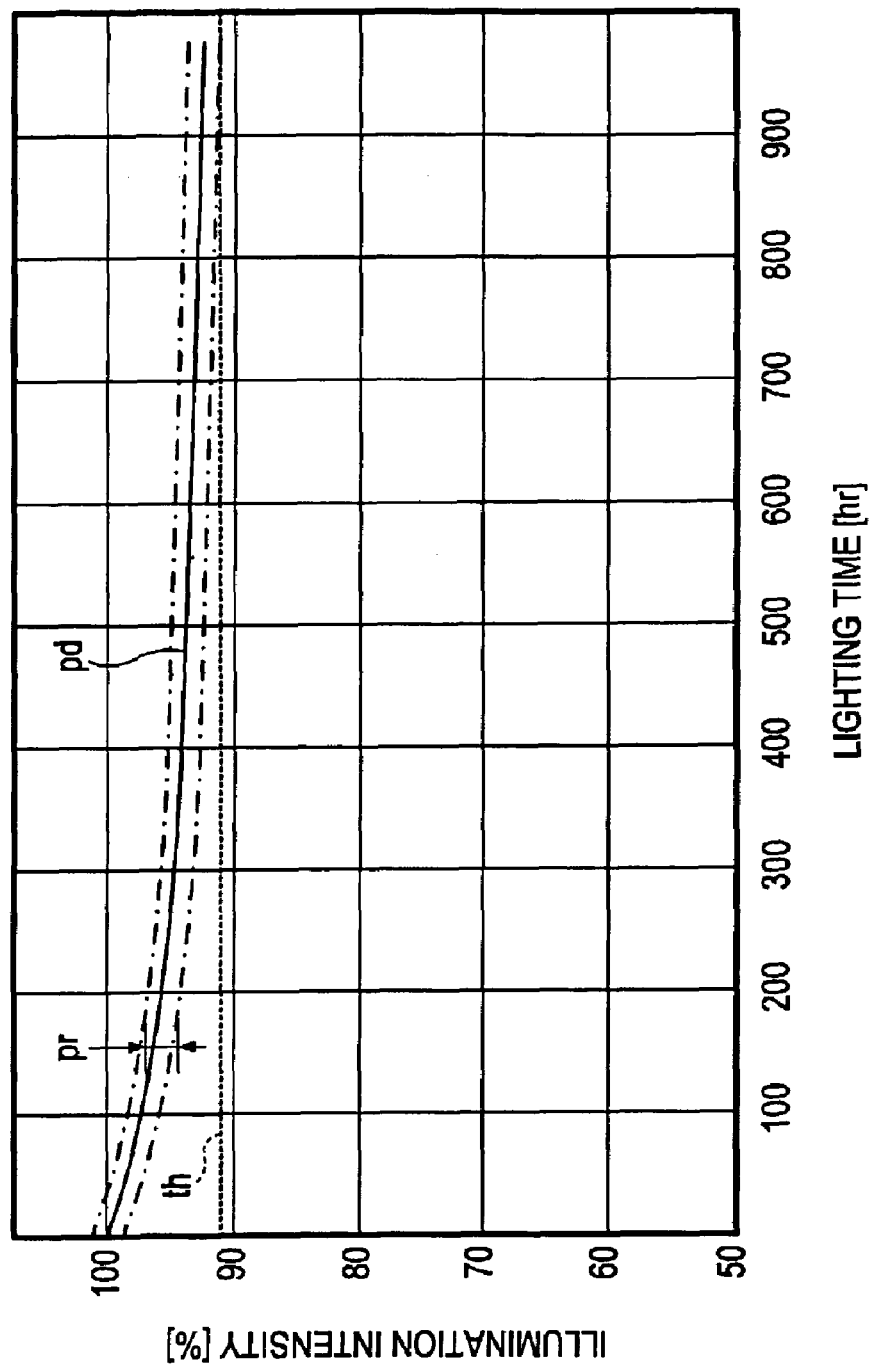
FIG. 9 is a graph showing the illumination characteristics "pd" of a high-pressure mercury lamp with time.

FIG. 9 is a graph showing illumination characteristics of a high-pressure mercury lamp with time. Its horizon axis indicates illumination intensity of a lamp, and its vertical axis indicates lighting time thereof. The illumination intensity curve "pd" is normalized by the initial illumination intensity. This curve reveals that the illumination intensity is decreasing gradually as lighting time is passing. When the intensity reaches the threshold "th", the exposure device 100 can no longer exhibit its intended property. Since the two lamps (10-1 and 10-2) are used in this embodiment, the memory circuit 82 stores the light intensity range "pr", taking their difference into account.

The first and second power supply controllers 19-1 and 19-2 adjust electric power supplied to the first and second high-pressure mercury lamps 10-1 and 10-2, respectively. The DMD driver circuit 83 operates the micro mirrors M arranged in a 1024 by 1280 matrix fashion, based on circuit patterns supplied from the control section 80. The object stage driver circuit 84 moves the object table 90 at a predetermined speed. The iris driver circuit 85 adjusts the iris adjusters 35-1 to 35-8 in such a way that the intensities of the light beams IL are nearly equal. The DMD driver circuit 83 controls the time period during which the orientation of each micro mirror M is maintained. The object stage driver circuit 84 drives the object table 90 at a prescribed speed.

The first optical sensor SS11 and the second optical sensor SS12 are arranged downstream from the detection windows 29 of the aperture members 20-1 and 20-2, respectively. The first and second optical sensors SS11 and SS12 detect the light intensities of the first and second high-pressure mercury lamps 10-1 and 10-2, respectively. Specifically, they independently detect the intensities of the light beams before the two light beams are split to eight. The first and second optical sensors SS11 and SS12 send their detection results to the control section 80.

Figure 10:
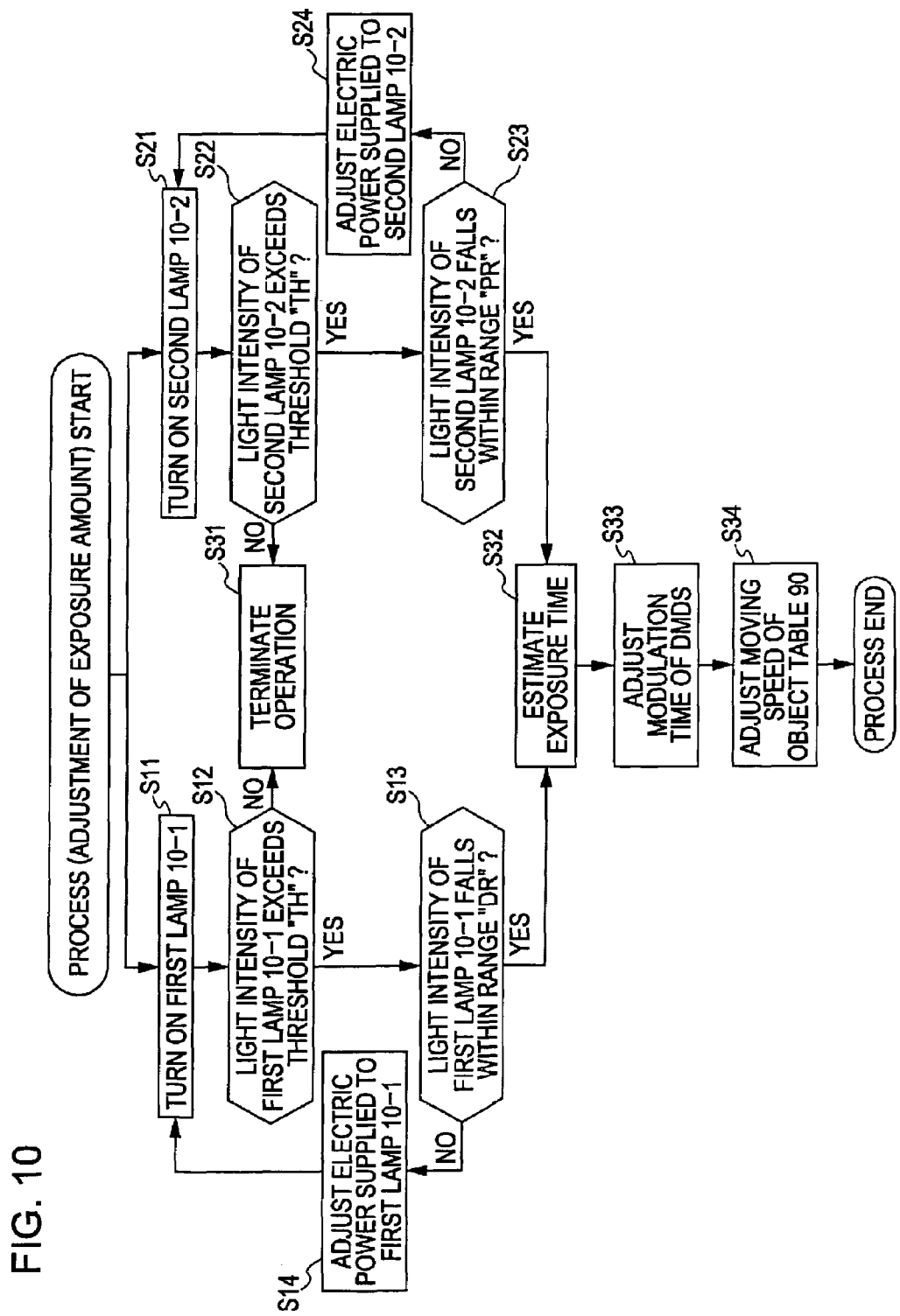
FIG. 10 is a flowchart of adjusting the light intensities of first and second high pressure mercury lamps 10-1 and 10-2.

FIG. 10 shows a process flow of adjusting the light intensities of the first and second high-pressure mercury lamps 10-1 and 10-2.

Referring to this flow, at steps S11 and S21, the power supply controllers 19-1 and 19-2 adjust electric power supplied to the first and second high-pressure mercury lamps 10-1 and 10-2, respectively. Consequently, both lamps illuminate at an appropriate intensity. Note that light intensity of a mercury lamp increases gradually since it is turned on, and it then stabilizes in several tens of minutes.

At the steps S12 and S22, the control section 80 determines whether or not the light intensities of the first and second high-pressure mercury lamps 10-1 and 10-2 reach the threshold "th." If the light intensity of the lamp 10-1 does not reach the threshold "th" ("No" at step S12), then the process proceeds to the step S31. Likewise, if the light intensity of the lamp 10-2 does not reach the threshold "th" ("No" at step S22), then the process proceeds to the step S31. At the step S31, the control section 80 rejects an operation of the exposure device 100. This aims at preventing the malfunction of the exposure device 100. In this case, examples of the rejected operation include the exposure or transfer setting through a keyboard and zero offset of the object table 90 through operation buttons. Even when the first and second high-pressure mercury lamps 10-1 and 10-2 illuminate, the setting operation that is executed through an input unit such as a keyboard or operation buttons except a power switch cannot be done unless their light intensity exceeds the threshold "th."

Otherwise, if the light intensity is more than the threshold "th" ("Yes" at steps S13 and S23), then the process proceeds to the steps S13 and S23, respectively.

At the steps S13 and S23, the control section 80 determines whether or not the light intensities of first and second high-pressure mercury lamps 10-1 and 10-2 falls within the preset range "pr." If the respective intensities of the lamps 10-1 and 10-2 are considerably different, then it is difficult to regulate the intensities of the eight split light beams. Therefore, the light intensities emitted from the first and second high-pressure mercury lamps 10-1 and 10-2 are required to be substantially the same.

If the light intensity of the first high-pressure mercury lamps 10-1 falls outside the range "pr" ("No" at step S13), then the process proceeds to the step S14. Otherwise ("Yes" at step S13), then the process proceeds to the step S32.

Likewise, if the light intensity of the second high-pressure mercury lamps 10-2 falls outside the range "pr" ("No" at step S23), then the process proceeds to the step S24. Otherwise ("Yes" at step S23), the process proceeds to the step S32.

At step S14, the first power supply controller 19-1 adjusts the electric power supplied to the first high-pressure mercury lamp 10-1 in order to adjust the light intensity of the first high-pressure mercury lamp 10-1.

At step S24, the second power supply controller 19-2 adjusts the electric power supplied to the second high-pressure mercury lamp 10-2 in order to adjust the light intensity of the second high-pressure mercury lamp 10-2.

At the step S32, the control section 80 estimates exposure time, based on the detected results of the first and second optical sensors SS11 and SS12 and the sensibility of photoresist coated on the subject.

At a step S33, the DMD driver circuit 83 drives the micro mirrors M in response to the instruction from the control section 80. Assuming that the optical sensor SS1 indicates a high intensity value, the DMD driver circuit 83 shortens the time period during which the micro mirrors M faces the object CB. This operation is effective especially in the case where the exposure light is too high even if the object table 90 moves at a maximum speed. Moreover, the light intensities of the first and second high-pressure mercury lamps 10-1 and 10-2 do not tend to be equal completely, even when the power supplied to the first and second power supply controllers 19-1 and 19-2 is adjusted. In this case, by adjusting the exposure time, this slight difference is compensated.

At a step S34, the object stage driver circuit 84 moves the object table 90 in response to the instruction from the control section 80. The object table 90 needs to move faster, as the light intensity detected by the optical sensor SS1 is higher.

In the above-described embodiment, the projection lighting systems 60-1 to 60-8 are stationary while the object table 90 is movable. However, the present invention is not limited to this configuration. Alternatively, may be employed a configuration in which the projection lighting systems 60-1 to 60-8 are movable and the object table 90 is stationary.

In this embodiment, the two high-pressure mercury lamps (10-1 and 10-2) may be used. However, the number of the lamps is not limited to two. Alternatively, the number of the lamps may be one or more than two. Furthermore, the single light beam is split into four beams in this embodiment, but it may be split into any number of beams.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. An exposure device for forming predetermined patterns onto an object, comprising:
   an optical source for emitting a ray containing a UV spectral line;
   an aperture member including first and second opening windows and a detection window, the first and second opening windows through which the ray from the optical source is split into first and second light beams, respectively, the detection window through which intensity of the ray is detected;
   first and second reflective optical elements for reflecting the first and second light beams that have passed through the first and second opening windows, respectively; and
   an optical sensor for detecting the intensity of the ray from the optical source which has passed through the detection window, the optical sensor being placed adjacent an area between the first and second reflective optical elements.

2. The exposure device according to claim 1, further comprising:
   a first spatial light modulator for spatially modulating the first light beam reflected by the first reflective optical element, based on inputted first image data;

a second spatial light modulator for spatially modulating the second light beam reflected by the second reflective optical element, based on inputted second image data; and a controller for controlling operations of the first and second spatial light modulators, depending on the intensity detected by the optical sensor.

3. The exposure device according to claim 2, further comprising an object stage for holding the object and for moving at a variable speed, the speed being changed by the controller, depending on the intensity detected by the optical sensor.

4. The exposure device according to claim 2, further comprising a power supply source for supplying electric power to the optical source, the electric power being changed by the controller, depending on the intensity detected by the optical sensor.

5. The exposure device according to claim 2,
wherein each of the first and second reflective optical elements is provided with a light-transmitting zone through which the ray from the detection window passes.

6. The exposure device according to claim 1, further comprising an object stage for holding the object and for moving at a variable speed, the speed being changed by the controller, depending on the intensity detected by the optical sensor.

7. The exposure device according to claim 1, further comprising a power supply source for supplying electric power to the optical source, the electric power being changed by the controller, depending on the intensity detected by the optical sensor.

8. The exposure device according to claim 1,
wherein each of the first and second reflective optical elements is provided with a light-transmitting zone through which the ray from the detection window passes.

9. The exposure device according to claim 1,
wherein the optical source comprises a high pressure mercury lamp, and
wherein an input operation becomes possible after the intensity detected by the optical sensor reaches a predetermined threshold.

10. An exposure device for forming predetermined patterns onto an object, comprising:
first and second optical sources for emitting rays containing a UV spectral line;
first and second power supply sources for supplying electric power to the first and second optical sources;
a first aperture member for first and second opening windows and a first detection window, the first and second opening windows through which the ray from the first optical source is split into first and second light beams, the first detection window through which intensity of the ray from the first optical source is detected;
a second aperture member for third and fourth opening windows and a second detection window, the third and fourth opening windows through which the ray from the second optical source is split into third and fourth light beams, the second detection window through which intensity of the ray from the second optical source is detected;
a first optical sensor for detecting the intensity of the ray from the first optical source through the first detection window;
a second optical sensor for detecting the intensity of the ray from the second optical source through the second detection window;
a power supply controller for controlling the first and second power supply sources in such a way that the intensities detected by the first and second optical sensors fall within a predetermined range;
first and second spatial light modulators for spatially modulating the first and second light beams that have passed through the first and second opening windows, based on inputted first and second image data, respectively;
third and fourth spatial light modulators for spatially modulating the third and fourth light beams that have passed through the third and fourth opening windows, based on inputted third and fourth image data, respectively; and
a controller for controlling operations of the first to forth spatial light modulators, based on difference between the intensities detected by the first and second optical sensors.

11. The exposure device according to claim 10, further comprising a memory unit for storing data on an age deterioration of the rays from the first and second light sources,
wherein status of routes between the first and second light sources and the first and second aperture members is detected by comparing time-based variation in the intensities detected by the first and second optical sensors with the data on the age deterioration stored in the memory unit.

12. The exposure device according to claim 11, further comprising first to fourth projection optical systems for guiding the first to fourth light beams from the first to fourth spatial light modulators to the object, respectively, the first to fourth projection systems being arrayed.

13. The exposure device according to claim 10, further comprising first to fourth projection optical systems for guiding the first to fourth light beams from the first to fourth spatial light modulators to the object, respectively, the first to fourth projection systems being arrayed.

14. The exposure device according to claim 10, further comprising an object stage for holding the object and for moving at a variable speed, the speed being changed by the controller, depending on the intensities detected by the first and second optical sensors.

15. The exposure device according to claim 10,
wherein each of the first and second optical sources comprises a high pressure mercury lamp, and
wherein an input operation becomes possible after both intensities detected by the first and second optical sensors reach a predetermined threshold.

* * * * *